(12) United States Patent
Luo et al.

(10) Patent No.: US 8,456,172 B2
(45) Date of Patent: Jun. 4, 2013

(54) MEASUREMENT CIRCUIT FOR CAPACITOR

(75) Inventors: Qi-Yan Luo, Shenzhen (CN); Song-Lin Tong, Shenzhen (CN); Peng Chen, Shenzhen (CN); Yun Bai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 390 days.

(21) Appl. No.: 12/981,507

(22) Filed: Dec. 30, 2010

(65) Prior Publication Data
US 2012/0161781 A1    Jun. 28, 2012

(30) Foreign Application Priority Data
Dec. 28, 2010   (CN) .......................... 2010 1 0608958

(51) Int. Cl.
*G01R 31/12*    (2006.01)
(52) U.S. Cl.
USPC .......................................... 324/548; 324/685

(58) Field of Classification Search
USPC ................................................ 324/548, 685
See application file for complete search history.

(56) References Cited

FOREIGN PATENT DOCUMENTS
JP          2005061835 A  *  3/2005

* cited by examiner

*Primary Examiner* — Vincent Q Nguyen
(74) *Attorney, Agent, or Firm* — Altis Law Group, Inc.

(57) ABSTRACT

A measurement circuit includes a switch unit with a number of keys selectively pressed to output different resistance regulating signals. A resistance setting circuit receives the resistance regulating signals and connects different resistances to a voltage circuit and a current circuit. The voltage circuit outputs different voltages. The current voltage receives a voltage from the voltage circuit and outputs a current to a capacitor. A detecting circuit measures a temperature of the capacitor and outputs the temperature to the resistance setting circuit. The resistance setting circuit compares the received temperature with a preset temperature. If the received temperature is equal to or greater than the preset temperature, the resistance setting circuit outputs short-circuit information of the capacitor. If the received temperature is less than the preset temperature, the resistance setting circuit outputs normal information of the capacitor. A display unit displays the information of the capacitor.

9 Claims, 4 Drawing Sheets

MEASUREMENT CIRCUIT FOR CAPACITOR

BACKGROUND

1. Field of the Invention

The present disclosure relates to measurement circuits, and particularly to a measurement circuit for measuring short-circuit of a capacitor.

2. Description of Related Art

At present, capacitors as energy storage, filtering, and decoupling components are widely used. Thus, capacitors are indispensable electronic components of electronic devices. However, during testing of the electronic devices, due to human or design errors, some of the capacitors may short-circuit. A way of determining which capacitors were short-circuited is to remove the capacitors, and then test the removed capacitors, however the leads of some of the removed capacitors may be damaged during removal and some of the good capacitors cannot be reused. Therefore, it is wasteful and costly.

BRIEF DESCRIPTION OF THE DRAWINGS

Many aspects of the embodiments can be better understood with reference to the following drawing. The components in the drawing are not necessarily drawn to scale, the emphasis instead being placed upon clearly illustrating the principles of the present embodiments. Moreover, in the drawing, like reference numerals designate corresponding parts throughout the several views.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
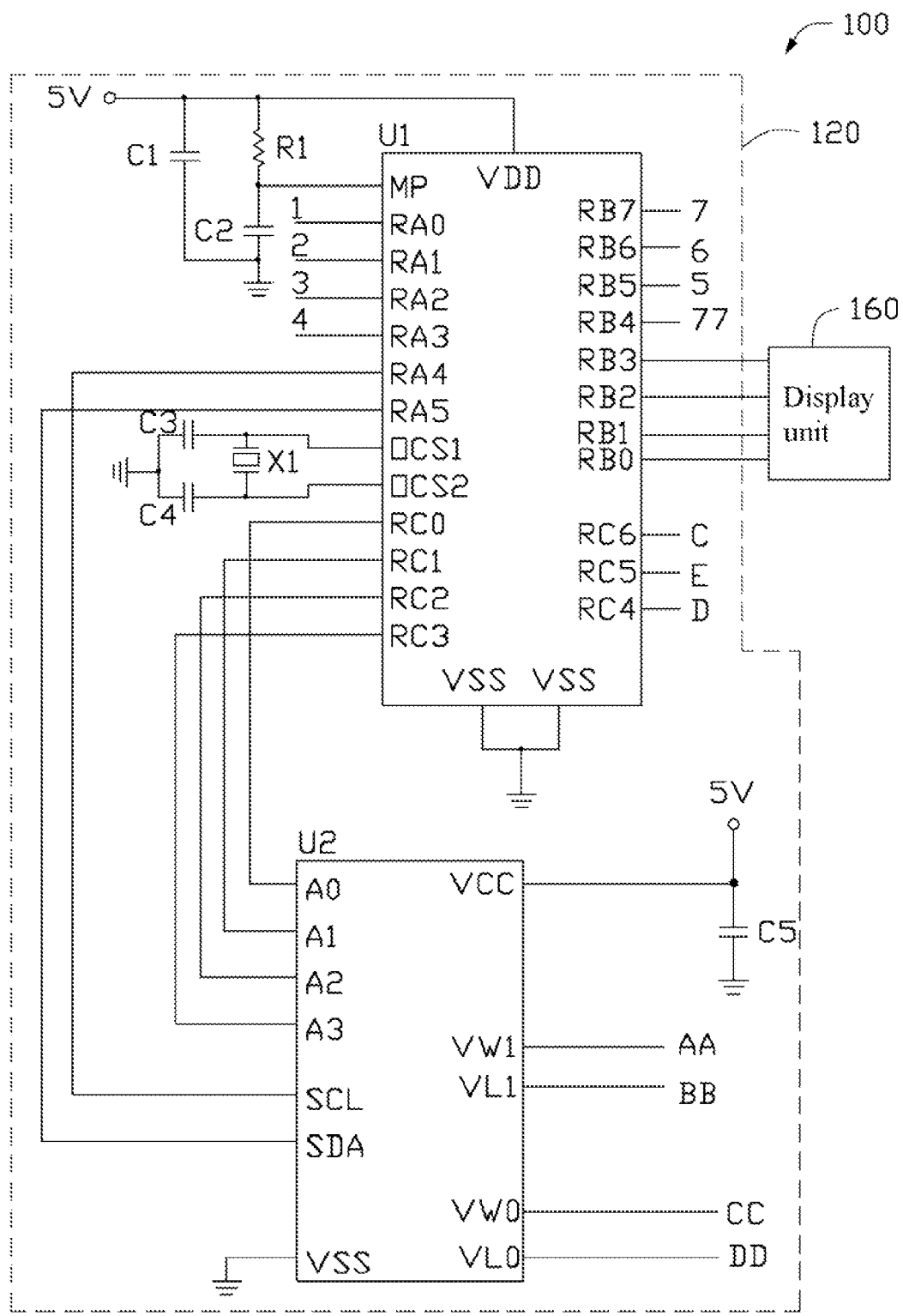
FIG. 1 to FIG. 4 are circuit diagrams of a measurement circuit for measuring short-circuit of a capacitor in accordance with an exemplary embodiment of the present disclosure.
Figure 2:
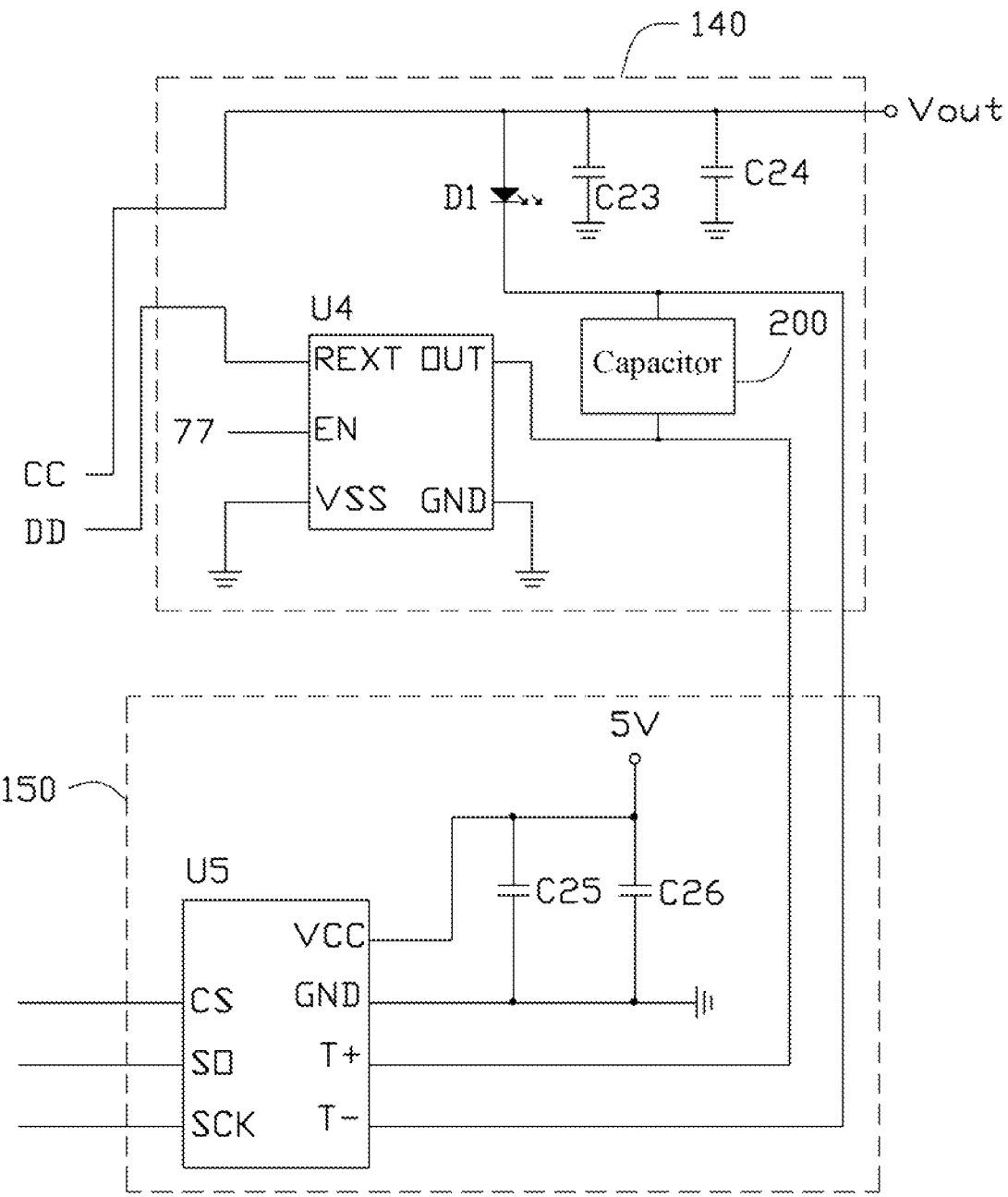
Figure 3:
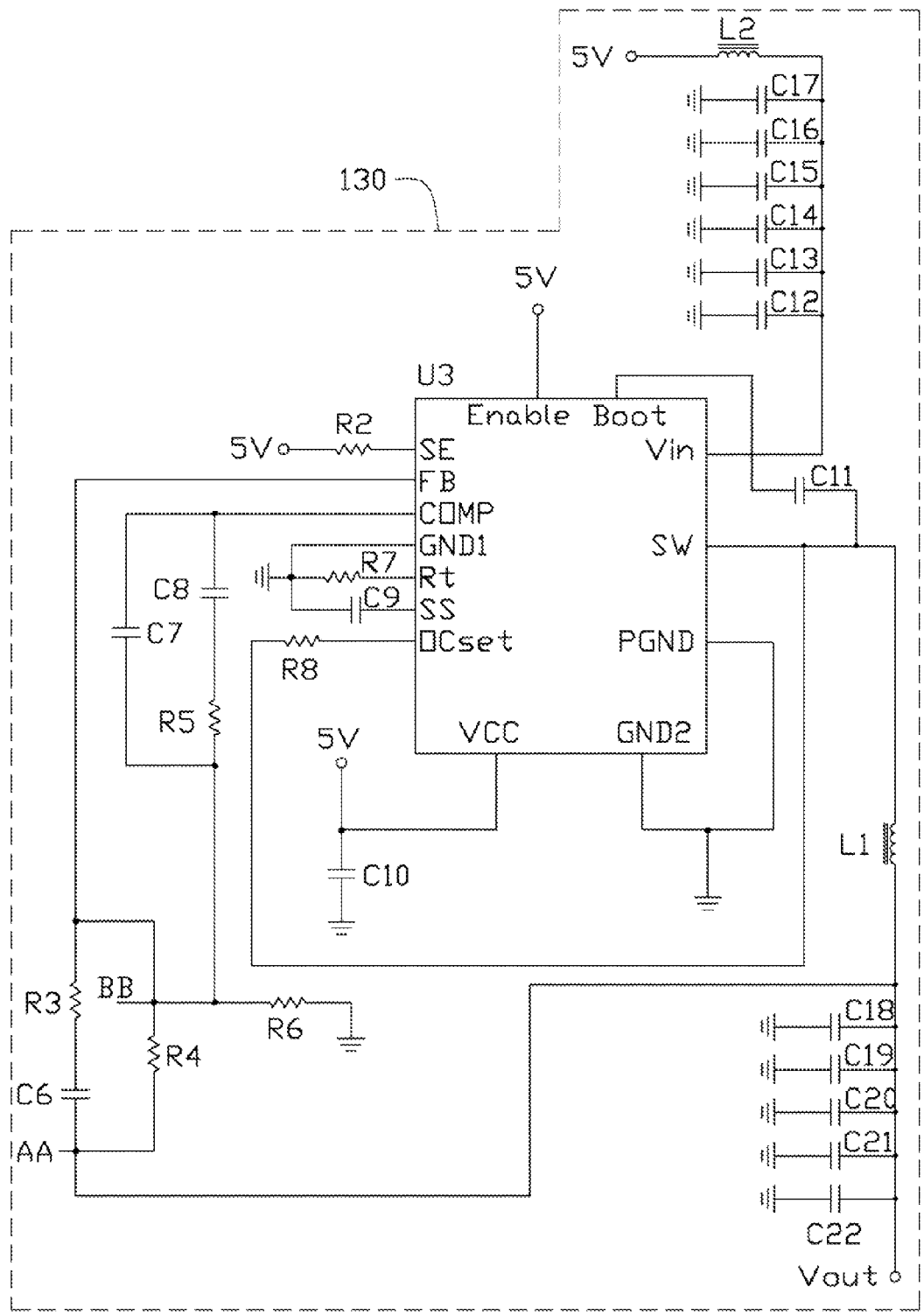
Figure 4:
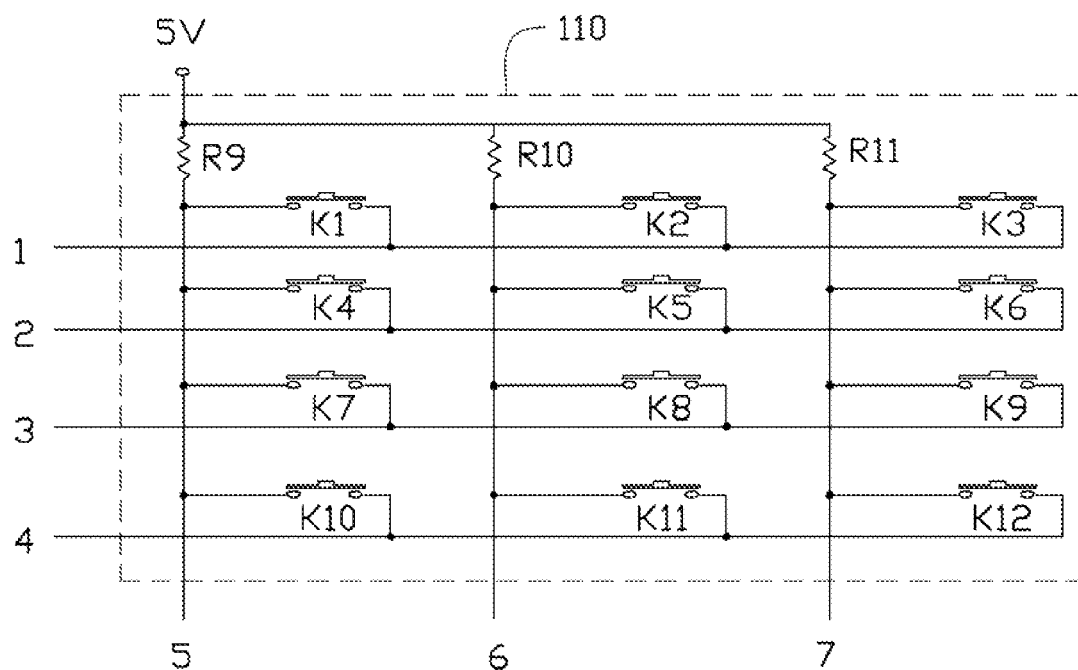

Referring to FIG. 1 to FIG. 4, a measurement circuit 100 is configured to measure short-circuit of a capacitor 200. The measurement circuit 100 in accordance with an exemplary embodiment includes a switch unit 110, a resistance setting circuit 120, a voltage circuit 130, a current circuit 140, a detecting circuit 150, and a display unit 160. The switch unit 110 is configured to output resistance regulating signals to the resistance setting circuit 120. The resistance setting circuit 120 is configured to connect different resistances to the voltage circuit 130 and the current circuit 140 according to the resistance regulating signals received from the switch unit 110. The voltage circuit 130 is configured to output different voltages to the current circuit 140 according to the connected resistances. The current circuit 140 is configured to receive the voltages from the voltage circuit 130 and output current to the capacitor 200 according to the voltage from the voltage circuit 130. The detecting circuit 150 is configured to measure a temperature of the capacitor 200 and output the temperature to the resistance setting circuit 120. The resistance setting circuit 120 compares the received temperature with a preset temperature, to determine whether the capacitor 200 is short-circuited. The display unit 160 displays the information of the capacitor 200.

The resistance setting circuit 120 includes a microcontroller U1, a digital regulation resistance U2, a resistor R1, capacitors C1-C5, and a crystal oscillator X1. A voltage pin VDD of the microcontroller U1 is connected to a power source 5V and also grounded through the resistor R1 and the capacitor C2 connected in series. A voltage pin MP of the microcontroller U1 is connected to a node between the resistor R1 and the capacitor C2. The capacitor C1 is connected between the power source 5V and ground. A clock pin OCS1 of the microcontroller U1 is grounded through the capacitor C3. A clock pin OCS2 of the microcontroller U1 is grounded through the capacitor C4. The crystal oscillator X1 is connected between the clock pins OCS1 and OCS2 of the microcontroller U1. Output pins RC0-RC3 of the microcontroller U1 are respectively connected to input pins A0-A3 of the digital regulation resistance U2. An output pin RA4 of the microcontroller U1 is connected to a clock pin SCL of the digital regulation resistance U2. An output pin RA5 of the microcontroller U1 is connected to a data pin SDA of the digital regulation resistance U2. A voltage pin VCC of the digital regulation resistance U2 is connected to the power source 5V and also grounded through the capacitor C5. Output pins VW1 and VL1 of the digital regulation resistance U2 are connected to the voltage circuit 130. Output pins VW0 and VL0 of the digital regulation resistance U2 are connected to the current circuit 140. Output pins RB0-RB3 of the microcontroller U1 are connected to the display unit 160. In one embodiment, the microcontroller U1 is a PIC16F73 microcontroller, and the digital regulation resistance U2 is an X9241 digital regulation resistance.

The voltage circuit 130 includes a converting chip U3, capacitors C6-C22, inductances L1 and L2, a voltage output terminal Vout, and resistors R2-R8. An input pin Vin of the converting chip U3 is connected to the power source 5V through the inductance L2. The capacitors C12-C17 are connected in parallel between the input pin Vin of the converting chip U3 and ground. An input/output (I/O) pin Boot of the converting chip U3 is connected to an I/O pin SW of the converting chip U3 through the capacitor C11. The I/O pin SW of the converting chip U3 is also connected to the voltage output terminal Vout through the inductance L1. The capacitors C18-C22 are connected in parallel between the voltage output terminal Vout and ground. An I/O pin SE of the converting chip U3 is connected to the power source 5V through the resistor R2. An I/O pin FB of the converting chip U3 is connected to a node between the inductance L1 and the capacitor C18 through the resistor R3 and the capacitor C6 connected in series. The resistor R4 is connected in parallel to the resistor R3 and the capacitor C6 connected in series. A first terminal of the resistor R6 is connected to a node between the resistor R3 and the resistor R4, and a second terminal of the resistor R6 is grounded. An I/O pin COMP of the converting chip U3 is connected to a node between the resistors R4 and R6 through the capacitor C7. The capacitor C7 is connected in parallel to the resistor R5 and the capacitor C8 are connected in series. An I/O pin Rt of the converting chip U3 is grounded through the resistor R7. An I/O pin SS of the converting chip U3 is grounded through the capacitor C9. An I/O pin OCset of the converting chip U3 is connected to the I/O pin SW of the converting chip U3 through the resistor R8. A voltage pin VCC of the converting chip U3 is connected to the power source 5V and also grounded through the capacitor C10. Ground pins GND1, GND2, and PGND of the converting chip U3 are grounded. The output pin VW1 of the digital regulating resistance U2 is connected to a node between the inductance L1 and the capacitor C18. The output pin VL1 of the digital regulation resistance U2 is connected to a node between the resistors R5 and R6. In one embodiment, the converting chip U3 is an IR3840WMTRPBF converting chip.

The current circuit 140 includes a current driving chip U4, a light emitting diode (LED) D1, and capacitors C23 and C24. A control pin REXT of the current driving chip U4 is connected to the output pin VL0 of the digital regulation resistance U2. An enable pin EN of the current driving chip U4 is connected to an output pin RB4 of the microcontroller U1. An output pin OUT of the current driving chip U4 is connected to a first end of the capacitor 200. A second end of the capacitor 200 is connected to a cathode of the LED D1. An anode of the LED D1 is connected to the voltage output terminal Vout and the output pin VW0 of the digital regulation resistance U2. The capacitors C23 and C24 are connected in parallel between the voltage output terminal Vout and ground. In one embodiment, the current driving chip U4 is a DD311 current driving chip.

The detecting circuit 150 includes a sensor U5 and capacitors C25 and C26. A select pin CS, an input pin SO, and a clock pin SCK of the sensor U5 are respectively connected to the output pins RC6, RC4, and RC5 of the microcontroller U1. Detecting pins T+ and T− of the sensor U5 are respectively connected to first and second ends of the capacitor 200. A voltage pin VCC of the sensor U5 is connected to the power source 5V. The capacitors C25 and C26 are connected in parallel between the voltage pin VCC of the sensor U5 and ground. A ground pin GND of the sensor U5 is grounded. In one embodiment, the sensor U5 is an MAX6675 sensor.

The switch unit 110 includes a plurality of keys, such as keys K1-K12, and resistors R9-R11. The keys K1-K12 are arranged in a 4*3 matrix. The keys K1-K8 are configured to output resistance regulating signals to the microcontroller U1. The keys K10-K12 are configured to be used to setting functions, such as "enter", "delete", and "start". The key K9 is inactive. The resistance setting circuit 120 receives the resistance regulating signals when the key K10 is pressed. The key K11 can be pressed to cancel operation after the keys K1-K8 are pressed. The switch unit 110 can be started when the key K12 is pressed.

The resistors R9-R11 are respectively connected between input pins RB5-RB7 of the microcontroller U1 and the power source 5V. First terminals of the keys K1-K3 are connected to an input pin RA0 of the microcontroller U1. Second terminals of the key K1-K3 are respectively connected to the input pins RB5, RB6, and RB7 of the microcontroller U1. First terminals of the keys K4-K6 are connected to an input pin RA1 of the microcontroller U1. Second terminals of the key K4-K6 are respectively connected to the input pins RB5, RB6, and RB7 of the microcontroller U1. First terminals of the keys K7-K9 are connected to an input pin RA2 of the microcontroller U1. Second terminals of the key K7-K9 are respectively connected to the input pins RB5, RB6, and RB7 of the microcontroller U1. First terminals of the keys K10-K12 are connected to an input pin RA3 of the microcontroller U1. Second terminals of the keys K10-K12 are respectively connected to the input terminals RB5, RB6, and RB7 of the microcontroller U1.

In use, the switch unit 110 is started when the key K12 is pressed, and then the keys K1-K8 are selectively pressed, to provide an eight-bit binary signal to the microcontroller U1. For example, if a voltage of the capacitor 200 is set with 1.5 volt (V), "11110000" is input to the microcontroller U1 when the keys K1-K4 are pressed and the keys K5-K8 are not pressed. The microcontroller U1 receives the signal "11110000" through pressing the key K10. The microcontroller U1 controls the digital regulation resistance U2 to connect a resistance to the converting chip U3 through the output pins VW1 and VL1 of the digital regulation resistance U2. The converting chip U3 converts a 5V to a 1.5V required by the capacitor 200 according to the connected resistance by the digital regulation resistance U2, and provides the 1.5V to the current circuit 140. The microcontroller U1 outputs an enable signal to the enable pin EN of the current driving chip U4 to make the current driving chip U4 work, and controls the digital regulation resistance U2 to connect a resistance to the current circuit 140. The output pin OUT of the current driving chip U4 outputs a high level signal to the first end of the capacitor 200. The voltage output terminal Vout outputs a high level signal to the second end of the capacitor 200 through the LED D1. If the capacitor 200 is short-circuited, the LED D1 is lit. At the same time, the sensor U5 measures a temperature of the capacitor 200 and outputs the temperature to the microcontroller U1. The microcontroller U1 compares the received temperature with a preset temperature, if the received temperature is equal to or greater than the preset temperature, the microcontroller U1 controls the display unit 160 to display a short-circuit information of the capacitor 200. If the received temperature is less than the preset temperature, the microcontroller U1 controls the display unit 160 to display a normal information of the capacitor 200. When a voltage of the capacitor 200 is changed, the resistance regulating signals are changed by selectively pressing the keys K1-K8, to make the microcontroller U1 control the digital regulation resistance U2 to connect other resistances to the voltage circuit 130 through the output pins VW1 and VL1, to make the converting chip U3 convert the 5V to a voltage required by the capacitor 200, the theory is same as above.

The measurement circuit 100 can automatically connect different resistances to the voltage circuit 130, to make the voltage circuit 130 output different voltages according to a requirement of the capacitor 200, and the measurement circuit 100 can also connect different resistances to the current circuit 140, to control the current circuit 140 to output current to the capacitor 200. The detecting circuit 150 measures a temperature of the capacitor 200 and outputs the temperature to the microcontroller U1. The microcontroller U1 compares the received temperature with a preset temperature and controls the display unit 160 to display a result. The measurement circuit 100 is simple and time-saving.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A measurement circuit for measuring short-circuit status capacitor, the measurement circuit comprising:
   a voltage circuit;
   a current circuit;
   a switch unit comprising a plurality of keys, wherein the plurality of keys are selectively pressed to output different resistance regulating signals;
   a resistance setting circuit to receive the resistance regulating signals from the switch unit and connect different resistances to the voltage circuit and the current circuit, wherein the voltage circuit outputs different voltages to the current circuit according to connected resistance by the resistance setting circuit, the current circuit receives a voltage from the voltage circuit and outputs current to the capacitor;
   a detecting circuit to measure a temperature of the capacitor and output the temperature to the resistance setting circuit, wherein the resistance setting circuit compares the received temperature with a preset temperature, upon a condition that the received temperature is equal to or greater than the preset temperature, the resistance setting circuit outputs a short-circuit information of the capacitor, upon a condition that the received temperature is less than the preset temperature, the resistance setting circuit outputs a normal information of the capacitor; and a display unit to display the short-circuit information or the normal information of the capacitor.

2. The measurement circuit as claimed in claim 1, wherein the resistance setting circuit comprises a microcontroller, a digital regulation resistance, a first resistor, first to fifth capacitors, and a crystal oscillator, a first voltage pin of the microcontroller is connected to a power source and also grounded through the first resistor and the second capacitor connected in series, a second voltage pin of the microcontroller is connected between the first resistor and the second capacitor, the first capacitor is connected between the first power source and ground, a first clock pin of the microcontroller is grounded through the third capacitor, a second clock pin of the microcontroller is grounded through the fourth capacitor, the crystal oscillator is connected between the first and the second clock pins of the microcontroller, first to fourth output pins of the microcontroller are respectively connected to first to fourth input pins of the digital regulation resistance, a fifth output pin of the microcontroller is connected to a clock pin of the digital regulation resistance, a sixth output pin of the microcontroller is connected to a data pin of the digital regulation resistance, a voltage pin of the digital regulation resistance is connected to the power source and also grounded through the fifth capacitor, first and second output pins of the digital regulation resistance are connected to the voltage circuit, third and fourth output pins of the digital regulation resistance are connected to the current circuit.

3. The measurement circuit as claimed in claim 2, wherein the voltage circuit comprises a converting chip, sixth to thirteen capacitors, first and second inductances, a voltage output terminal, and second to eighth resistors, a first input/output (I/O) pin of the converting chip is connected to the power source through the first inductance, the sixth capacitor is connected between the first I/O pin of the converting chip and ground, a second I/O pin of the converting chip is connected to a third I/O pin of the converting chip through the seventh capacitor, the third I/O pin of the converting chip is connected to the voltage output terminal through the second inductance, the fourth capacitor is connected between the voltage output terminal and ground, a fourth I/O pin of the converting chip is connected to the power source through the second resistor, a fifth I/O pin of the converting chip is connected between the second inductance and the eighth capacitor through the third resistor and the ninth capacitor connected in series, the fourth resistor is connected in parallel to the third resistor and the ninth capacitor connected in series, the sixth resistor is connected between the fourth resistor and ground, a sixth I/O pin of the converting chip is connected between the fourth and the sixth resistors through the tenth capacitor and the fifth resistor connected in series, the eleventh capacitor is connected in parallel to the fifth resistor and the tenth capacitor connected in series, a seventh I/O pin of the converting chip is grounded through the twelve capacitor, an eighth I/O pin of the converting chip is connected to the third I/O pin of the converting chip through the eight resistor, a voltage pin of the converting chip is connected to the power source and also grounded through the thirteenth capacitor, a ninth I/O pin of the converting chip is grounded through the seventh resistor, the first output pin of the digital regulation resistance is connected to a node between the second inductance and the ninth capacitor, the second output pin of the digital regulation resistance is connected to a node between the fourth and the sixth resistors.

4. The measurement circuit as claimed in claim 3, wherein the current circuit comprises a current driving chip, a light emitting diode (LED), and fourteenth and fifteenth capacitors, a control pin of the current driving chip is connected to the third output pin of the digital regulation resistance, an enable pin of the current driving chip is connected to a seventh output pin of the microcontroller, an output pin of the current driving chip is connected to a first end of the capacitor, a second end of the capacitor is connected to a cathode of the LED, an anode of the LED is connected to the voltage output terminal and the fourth output pin of the digital regulation resistance, the fourteenth and the fifteenth capacitors are connected in parallel between the voltage output terminal and ground.

5. The measurement circuit as claimed in claim 4, wherein the detecting circuit comprises a sensor and sixteenth and seventeenth capacitors, a select pin, an input pin, and a clock pin of the sensor are respectively connected to eighth to tenth output pins of the microcontroller, first and second detecting pins of the sensor are respectively connected to the first and the second ends of the capacitor, a voltage pin of the sensor is connected to the power source, the sixteenth and the seventeenth capacitors are connected in parallel between the voltage pin of the sensor and ground.

6. The measurement circuit as claimed in claim 5, wherein eleventh to fourteenth output pins of the microcontroller are connected to the display unit.

7. The measurement circuit as claimed in claim 6, wherein the switch unit comprises first to eight keys, first terminals of the first to the third keys are connected to a first input pin of the microcontroller, second terminals of the first to the third keys are respectively connected to fifth to seventh input pins of the microcontroller, first terminals of the fourth to the sixth keys are connected to a second input pin of the microcontroller, second terminals of the fourth to the sixth keys are respectively connected to the fifth to seventh input pins of the microcontroller, first terminals of the seventh and the eighth keys are connected to a third input pin of the microcontroller, second terminals of the seventh and the eighth keys are respectively connected to the fifth and the sixth input pins of the microcontroller.

8. The measurement circuit as claimed in claim 7, wherein the switch unit further comprises ninth to twelve keys, the ninth key is inactive, the tenth to the twelve keys are configured to be used to setting functions "enter", "delete", and "start", the resistance setting circuit receives the resistance regulating signals when the tenth key is pressed, the eleventh key is pressed to cancel operations after the first to eight keys are pressed, the switch unit is started when the twelve key is pressed, a first terminal of the ninth key is connected to the third input pin of the microcontroller, a second terminal of the ninth key is connected to the seventh input pin of the microcontroller, first terminals of the tenth to the twelve keys are connected to a fourth input pin of the microcontroller, second terminals of the tenth to the twelve keys are respectively connected to the fifth to the seventh input pins of the microcontroller.

9. The measurement circuit as claimed in claim 8, wherein the switch unit further comprises ninth to eleventh resistors, the ninth resistor is connected between the power source and the second terminals of the first key, the fourth key, the seventh key, and the tenth key, wherein the tenth resistor is connected between the power source and the second terminals of the second key, the fifth key, the eighth key, and the eleventh key, wherein the eleventh resistor is connected between the first power source and the second terminals of the third key, the sixth key, the ninth key, and the twelfth key.

* * * * *